United States Patent [19]
Jaecklin et al.

[11] 3,943,549
[45] Mar. 9, 1976

[54] THYRISTOR

[75] Inventors: Andre A. Jaecklin, Ennetbaden; Josef Cornu, Staretschwil; Manfred Lietz, Wurenlos, all of Switzerland

[73] Assignee: BBC Brown, Boveri & Company, Limited, Baden, Switzerland

[22] Filed: Dec. 5, 1974

[21] Appl. No.: 529,955

Related U.S. Application Data
[63] Continuation of Ser. No. 336,555, Feb. 28, 1973, abandoned.

[30] Foreign Application Priority Data
Mar. 15, 1972 Switzerland.......................... 3766/72

[52] U.S. Cl. ...................... 357/38; 357/64; 148/187
[51] Int. Cl.² ........................................ H01L 29/74
[58] Field of Search .................... 357/13, 38, 64, 90

[56] References Cited
UNITED STATES PATENTS

| | | | |
|---|---|---|---|
| 3,246,172 | 4/1966 | Sanford................................. | 357/38 |
| 3,312,880 | 4/1967 | Longo et al........................... | 357/38 |
| 3,408,545 | 10/1968 | DeCello et al....................... | 357/38 |
| 3,860,947 | 1/1975 | Gamo et al. ......................... | 357/38 |

FOREIGN PATENTS OR APPLICATIONS

| | | | |
|---|---|---|---|
| 1,239,595 | 7/1971 | United Kingdom................... | 357/38 |

*Primary Examiner*—Andrew J. James
*Assistant Examiner*—Joseph E. Clawson, Jr.
*Attorney, Agent, or Firm*—Oblon, Fisher, Spivak, McClelland & Maier

[57] ABSTRACT

A thyristor having improved high frequency performance is disclosed. The thyristor includes at least two parallel sequences of semiconductor zones wherein the carrier lifetime in the base region of a first sequence of zones is higher than in the corresponding base region of the second sequence of zones. The second sequence of zones is also more heavily doped at its outer extremities than the first sequence of zones. A method of making the improved thyristor is also disclosed and includes the step of diffusing recombination centers into the second sequence of zones in order to decrease carrier lifetime.

4 Claims, 3 Drawing Figures

THYRISTOR

This is a continuation of application Ser. No. 336,555 filed Feb. 28, 1973, now abandoned.

BACKGROUND OF THE INVENTION

1. Field of the Invention

The present invention generally relates to a thyristor and method of making same and more particularly to a thyristor and method of making same having greatly improved turn-on characteristics.

2. Description of the Prior Art

In the past, thyristors used mostly as high speed, low current switches were made such that the lifetime of carriers in middle semiconductor zones, or base zones, was relatively short in order to reduce the recovery time of the thyristor. The lifetime of the carriers could not, however, be reduced arbitrarily because below a certain limiting value of carrier lifetime, the thyristor could no longer be fired with normal gate currents.

While prior thyristors were generally somewhat satisfactory for many switching applications, the speed of turn-on of prior thyristors, being limited by base zone carrier lifetime, was itself limited.

SUMMARY OF THE INVENTION

Accordingly, one object of the present invention is to provide a new and improved unique thyristor and method of making the same.

Another object of the present invention is to provide a new and improved unique thyristor and method of making the same which has an improved turn-on characteristic.

A still further object of the present invention is to provide a new and improved unique thyristor and method of making the same which has a small base region carrier lifetime.

Yet another object of the present invention is to provide a new and improved unique thyristor and method of making the same which is capable of being fired without supplying any base current by surpassing a thyristor breakover voltage.

One other object of the present invention is to provide a new and improved unique thyristor and method of making same which has an improved $di/dt$ capability.

Briefly, in accordance with this invention, the foregoing and other objects are in one aspect attained by providing a thyristor with a plurality of parallel sequences of zones wherein the carrier lifetime in a base of a first sequence of zones is higher than in a corresponding semiconductor zone of the other sequences of zones and the doping profile of the other sequences of zones has a steeper forward characteristic than the first sequence of zones. Zones having different carrier lifetimes are fabricated using doping and masking techniques.

BRIEF DESCRIPTION OF THE DRAWINGS

A more complete appreciation of the invention will be readily obtained as the same becomes better understood by reference to the following detailed description when considered in connection with the accompanying drawings wherein.

DETAILED DESCRIPTION OF THE PREFERRED EMBODIMENTS

Figure 1:
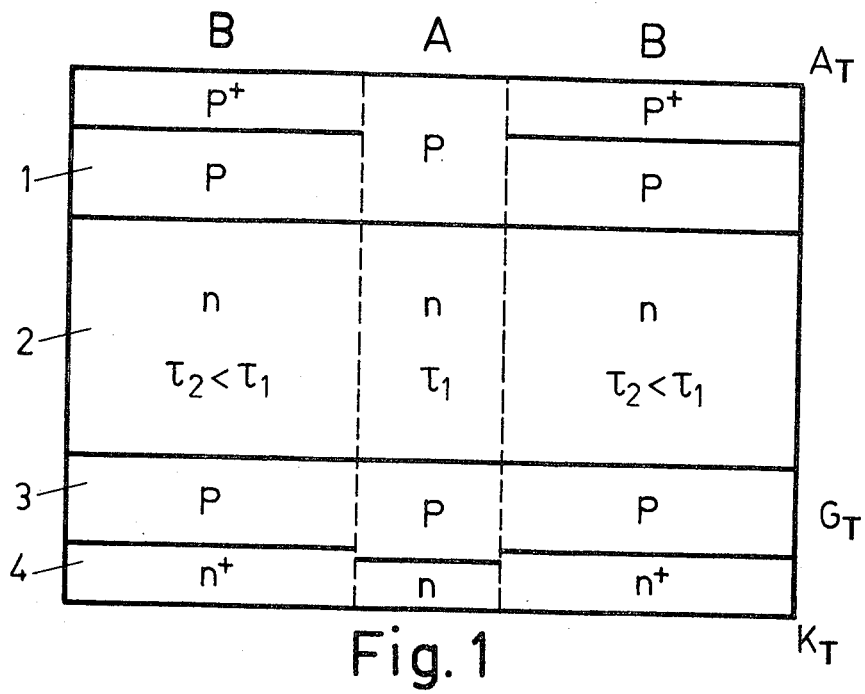
FIG. 1 is a cross-section view of the structure of the thyristor exemplifying the present invention.

FIG. 1 thereof, which shows a schematic representation of the cross-section of a pnpn-thyristor, which comprises a p-zone 1, an n-zone 2 called a base, a middle p-zone 3 provided with a gate contact $G_T$ and an n-zone 4. A first region, which in FIG. 1 is denoted as sequence of zones A is made such that the charge carriers in the base 2 have a longer lifetime than in the neighboring bases which belong to the sequence of zones B. The lifetime of the charge carriers in the base of the first sequence of zones A is called $\tau_1$, whereas in the base of the second sequence of zones B it is called $\tau_2$, where $\tau_2 < \tau_1$. When the p-n junction between the zones 3 and 4 is subjected to a gate current through the gate contact $G_T$, the thyristor will be fired faster in the sequence of zones A, in which the lifetime of the carriers in the base is longer, than in the sequence of zones B. Once the carriers flow in the sequence of zones A, the flow of charge carriers expands over the rest of the structure.

The aforementioned expansion of the flow of charge carriers can be stimulated through special dimensioning of the electrodes. One can, for example introduce a so-called "Querfeldemitter", where a part of the emitter which interacts with a gate electrode is not metallized. In such a case the flow of charge carriers is restricted additionally by the transverse resistance of the uncontacted emitter. The electric drift field causes a spatial expansion of the current carrying region, which brings it from the small region in the vicinity of the gate electrode, which was fired first of all, to the complete edge zone of the uncontacted region.

Figure 2:
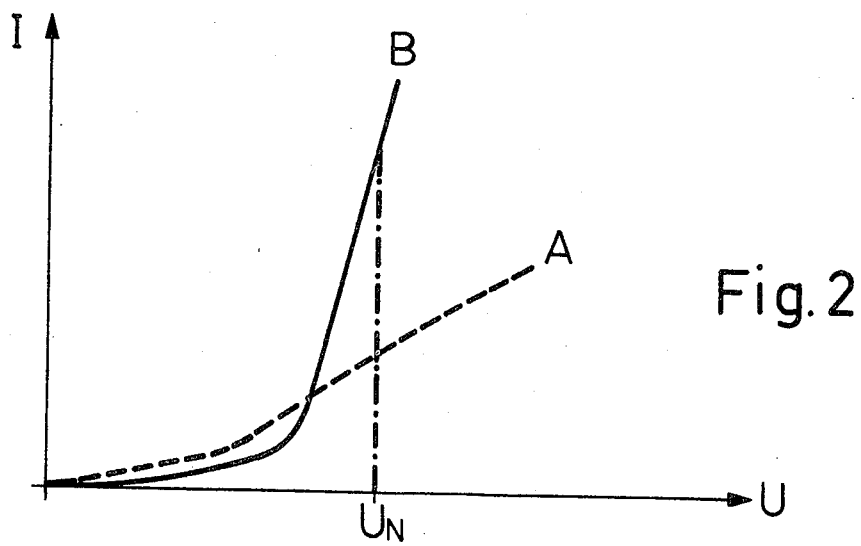
FIG. 2 is a graph showing forward characteristics of both sequences of zones of the thyristor of FIG. 1.

Under the assumption that both regions have the same doping profile, the forward voltage drop for a certain current density would be smaller in the first semiconductor region A than in the other region B, because of the higher carrier lifetime. This would cause an inhomogeneous distribution of the current. In order to avoid this, forward characteristics for the regions A and B are chosen as indicated in FIG. 2. In the region of operation, that is, in the vicinity of a nominal voltage $U_N$, the slope of the forward characteristic is smaller for the sequence of zones A than for the sequence of zones B.

To realize such a characteristic one can, for example, have the external regions of the p-zone 1 and the n-zone 4 doped lower in the sequence of zones A than in the corresponding zones in the second sequence of zones B. This makes the injection of charge carriers in the base 2 in the first sequence of zones A smaller than that in the case of homogeneous doping, especially at high current densities. This effects a desired higher forward voltage drop at high currents. Hence in the region of operation, the first succession of zones A carries only a relatively small current in comparison with that the sequence of zones B. The carrier density in the base 2 in the sequence of zones A is hence relatively small. Accordingly, when such a thyristor is turned off, strong recombination takes place in the regions with short lifetime. In the regions in which the lifetime of the carriers is higher, the carrier density was already smaller before the turn-off, so that this sequence of zones does not increase the total recovery time of the thyristor.

Figure 3:
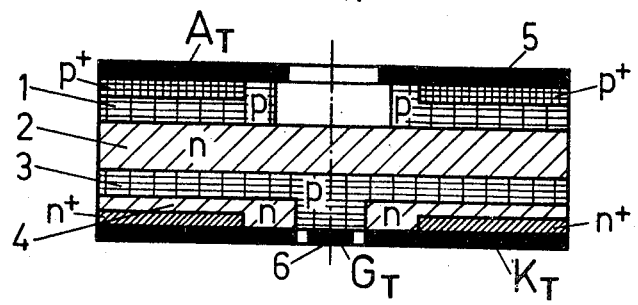
FIG. 3 is a cross-section view of an example of a thyristor according to the present invention with a circular emitter electrode.

An especially good thyristor of the described type consists of a circular semiconductor disk, a cross-section of which is shown in FIG. 3, with a sequence of zones pnpn, where the upper p-zone is partly covered by a ring-shaped metal contact 5, which acts as an anode $A_T$. A gate contact 6 also called $G_T$, is made on a p-zone 3 and a cathode contact $K_T$ is made on a zone 4. The base region where the charge carriers have the longest lifetime is appropriately situated approximately underneath the part of the surface which is not covered by the metal contact 5. This region does not require an annular shape but can have any particular shape, for example that of a star or any other branching pattern. It can also have many isle-like regions. An expansion of a developing plasma is known to take place faster in the regions with a high carrier lifetime than in other regions. Therefore a suitable choice of a pattern for the base region 2 in the sequence of zones A results in a considerable improvement in the *di/dt* capability of the thyristor.

The described thyristor can also be fired by surpassing the breakover voltage, because the first sequence of zones A, the middle region in FIG. 3, can more easily be fired than the other regions. By changing the doping profile of the p-zones the blocking characteristics can be varied for both polarities. In this way differences of the order of 300 V can be obtained.

Through a suitable choice of the doping profile it is also possible to determine the penetration depth of the space charge layer in the base 2. When the doping profile in the p-zone 3 is made steeper in the first sequence of zones A than in the other regions, one obtains a larger penetration depth of the space charge region in an n-base 2 in the first sequence of zones A. Therefore the thyristor can be fired more easily in this region because a neutral part of the n-base becomes thinner. Because a long carrier lifetime and a steep doping profile have the same influence, one can use them seperately or combined to improve the turn-on characteristic of the thyristor.

It should be mentioned that the choice of a long carrier lifetime in the sequence of zones A to improve the turn-on behaviour is only significant in the vicinity of the anode $A_T$, i.e. in using the aforementioned doping technique the lifetime on the emitter side can be chosen as small as in the rest of the structure.

To obtain a reduction of the lifetime of the charge carriers in the sequence of zones B, recombination centers are diffused in, following a method well known to one skilled in the art. Such a diffusion process can be done with Au or Ni or another material which reduces the lifetime. During this process the regions corresponding to the sequence of zones A must be covered with the help of masking techniques.

To obtain a reduced doping of the n-zone A in the sequence of zones A one can cover this zone with the help of masking techniques during an $n^+$-diffusion. This applies also to the production of a p-zone 1 with lower doping in the sequence of zones A. Whether this is necessary depends however on the type of realization in question. If a lower doping level is necessary, it can not only be realized through masking but also through a different choice of the doping material. Different doping profiles can be realized by chosing different p-doping materials. All highly doped zones can also be realized by alloying with an appropriate material instead of by diffusion.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A thyristor having improved high frequency response and optimum current distribution comprising:
   at least first and second adjacent sequences of semiconductor zones,
   an electrode engaging both said first and second sequences of semiconductor zones,
   both said first and second sequences of semiconductor zones including centrally located base zones and further including outer zones on either side of said base zones,
   said base zones in said first sequence of semiconductor zones formed of a material having a first charge carrier lifetime,
   said base zone in said second sequence of semiconductor zones formed of a material having a second charge carrier lifetime, said first charge carrier lifetime being greater than said second charge carrier lifetime; and,
   said outer zones in said first sequence of semiconductor zones including regions of lower doping concentration than corresponding regions of outer zones in said second sequence of semiconductor zones,
   whereby said first sequence of semiconductor zones is more easily fired than said second sequence of zones and said fired state readily penetrates said second sequence of semiconductor zones to provide improved high frequency response and optimum current distribution.

2. A thyristor as in claim 1, wherein:
   said first sequence of semiconductor zones is constructed to have a higher forward voltage drop for high currents than said second sequence of semiconductor zones.

3. A thyristor as in claim 2, wherein:
   said outer zones include an external p-zone and an external n-zone, said external p-zone and said external n-zone of said second sequence of semiconductor of zones being more highly doped than the corresponding portions of said first sequence of semiconductor zones, 4. A thyristor as in claim 1, further comprising:
   an external emitter zone; and
   a ring-shaped metallic contact on said external emitter zone.

* * * * *